United States Patent
Sasaki

[11] Patent Number: 5,276,010
[45] Date of Patent: Jan. 4, 1994

[54] PROCESS FOR PRODUCING BISMUTH-BASED OXIDE SUPERCONDUCTING FILMS

[75] Inventor: Nobuo Sasaki, Kawasaki, Japan
[73] Assignee: Fujitsu Limited, Kanagawa, Japan
[21] Appl. No.: 655,890
[22] Filed: Feb. 15, 1991
[30] Foreign Application Priority Data
Feb. 20, 1990 [JP] Japan ................. 2-037267
[51] Int. Cl.$^5$ ............................ B05D 5/12
[52] U.S. Cl. ..................... 505/1; 505/730; 505/731; 505/732; 505/742; 427/62; 427/126.3
[58] Field of Search ............ 505/1, 730, 731, 732, 505/742, 729; 427/62, 63, 126.3

[56] References Cited
FOREIGN PATENT DOCUMENTS
1-167912  7/1989  Japan.

OTHER PUBLICATIONS

Paserin et al, "Vacuum deposition of multilayer Bi-Ca-Sr-Cu-O superconducting thin films", Appl. Phys. lett. 53(7) Aug. 1988 pp. 624–625.
Kuroda et al, "Preparation of New High-$T_c$ Superconducting Oxide Bi-Sr-Ca-Cu-O Thin Film by Electron Beam Deposition Technique", Jpn. J. Appl. Phys. 27(4) Apr. 1988 L625-627.
Qui et al, "Y-Ba-Cu-O thin films prepared by a multilayer vacuum method", Appl. Phys. Lett. 52(7) Feb. 1988 pp. 587–589.
Azoulay et al, "Preparation of very thin superconducting films of Y-Ba-Cu-O by a layer-by-layer resistive evaporation", J. Appl. Phys. 66(8) Oct. 1989 pp. 3937–3939.
Tsaur et al, "Preparation of superconducting $YBa_2Cu_3O_x$ thin films by oxygen annealing of multilayer metal films", Appl. Phys. lett. 51(11) Sep. 1987 pp. 858–860.
Bao et al, "YBaCuO superconducting thin films with zero resistance at 84k by multilayer deposition". Appl. Phys. lett.51(12) Sep. 1987, pp. 946–947.
"Epitaxial Growth of High-Temperature Superconducting Thin Films", Eckstein et al, Journal of Vacuum Science Technology, B7 (2), Mar./Apr., 1989, pp. 319–323.

Primary Examiner—Roy King
Attorney, Agent, or Firm—Armstrong, Westerman, Hattori, McLeland & Naughton

[57] ABSTRACT

A process for producing an oxide crystalline thin film having a structure in which atomic layers having different chemical compositions are laminated along the film thickness direction, the process including the steps of depositing amorphous atomic layers on a substrate, layer by layer and heating the amorphous deposit to crystallize the deposit, the respective amorphous atomic layers having the same chemical compositions as those of the corresponding atomic layers of the oxide crystal structure and being stacked in an order corresponding to the atomic lamination of the crystal structure.

3 Claims, 4 Drawing Sheets

PROCESS FOR PRODUCING BISMUTH-BASED OXIDE SUPERCONDUCTING FILMS

BACKGROUND OF THE INVENTION

1. Field of the Invention

The present invention relates to a process for producing an oxide crystal thin film.

2. Description of the Related Art

Two types of processes for producing an oxide crystal thin film are known, i.e., a process in which a mixture of component powders is fired at a high temperature, and a process in which a crystallization is simultaneously effected during deposition on a heated substrate by vapor deposition or sputtering.

In a multiple component oxide, however, phases having close free energies of formation grow simultaneously to form a mixture of phases containing undesired phases, and thus a required property cannot be obtained. Moreover, particularly in a thin film, a three dimensional nucleation "Q" occurs on a substrate "P", as shown in FIG. 4, which causes an uneven film surface and makes it impossible to provide a good thin film having a flat surface.

The mixed phases and the three dimensional nucleation are a serious defect in materials such as oxide superconductor thin films having properties which are adversely affected by these phenomena.

The oxide superconductor has a very high critical temperature, Tc, in comparison with that of metal alloy superconductors, and therefore, is thought to be suitable for various applications, including conductors in memories and logic circuits, etc., of computers, superconductor magnets, superconducting cables, superconducting electric power storage, and other general electrical wiring, and for other applications thereof including magnetically levitated trains, accelerators, and medical devices, etc.

The oxide superconductor is composed of numerous component elements, and the superconductive properties including the critical temperature are very sensitive to the chemical composition of the oxide, and thus an inclusion of phases other than a single desired phase of a predetermined chemical composition must be prevented. Moreover, particularly in a thin film, a three-dimensional nucleation, which causes an uneven film surface, must be prevented at all costs.

$Bi_2Sr_2Ca_2Cu_3O_{10}$, for example, is a high temperature superconductor having a highest level of Tc (110K) among known superconducting substances, but when producing $Bi_2Sr_2Ca_2Cu_3O_{10}$ by a process including a firing of a powder mixture, a problem arises in that a solid state reaction induced by the heating for the firing causes a ready formation of a mixture of three phases having close free energies of formation, i.e., a $Bi_2Sr_2Cu_1O_6$ phase having a Tc of 7K, a Bi phase having a Tc of 80K, and =Bi a Tc of 110K, and therefore, the characteristic excellent properties expected from a single $Bi_2Sr_2Ca_2Cu_3O_{10}$ phase cannot be obtained. Moreover, another problem arises in that a thin film having a flat surface cannot be obtained, because a three-dimensional nucleation readily occurs.

The same problems arise, for example, in a process for producing an oxide superconductor coating as disclosed in Japanese Unexamined Patent Publication (Kokai) No. 1-167912, in which a $RBa_2Cu_3O_{7-x}$ type oxide superconductor is vapor-deposited on an MgO crystal substrate heated at a temperature of 500° C. or lower, to form an amorphous film which is then heated to a temperature of from 800° to 950° C. to be crystallized, followed by a heating at a temperature of from 400° to 550° C. to transform the film into a superconductor.

Another process was proposed by J. N. Eckstein et al. in the Journal of Vacuum Science Technology, B7(2), March/April 1989, pages 319-323, in which oxide superconductor thin films, such as $Bi_2Sr_2Ca_2Cu_3O_{10}$, are formed by a continuous deposition on a substrate heated and held at a temperature high enough to induce a simultaneous crystallization of a deposit on the substrate. In this process, the deposition is carried out in such a manner that atomic layers having predetermined chemical compositions are deposited layer-by-layer on the substrate, and that each deposited atomic layer is immediately crystallized upon contact with the heated substrate, i.e., simultaneously with the deposition thereof. This process, however, does not consider the prevention of an occurrence of an uneven film surface due to a three-dimensional growth, which often occurs at a substrate temperature high enough to induce the simultaneous crystallization of the atomic layer when deposited on the substrate.

SUMMARY OF THE INVENTION

The object of the present invention is to provide a process for producing an oxide crystal thin film composed of a desired single phase and having a flat surface, by preventing the inclusion of undesired phases and the three-dimensional nucleation.

To achieve the above object according to the present invention, there is provided a process for producing an oxide crystal thin film having a structure in which atomic layers having different chemical compositions are laminated along the film thickness direction, this process comprising the steps of:

depositing amorphous atomic layers on a substrate, layer by layer, the amorphous atomic layers respectively having chemical compositions corresponding to those of atomic layers of the oxide crystal structure and being arranged in an order corresponding to the lamination of said crystal structure, to form an amorphous deposit having lower and upper outermost amorphous atomic layers having chemical compositions corresponding to those of the atomic layers of the crystal structure that have relatively low interlayer bonding strengths; and heating the amorphous deposit to crystallize the deposit.

DESCRIPTION OF THE PREFERRED EMBODIMENTS

Figure 1:
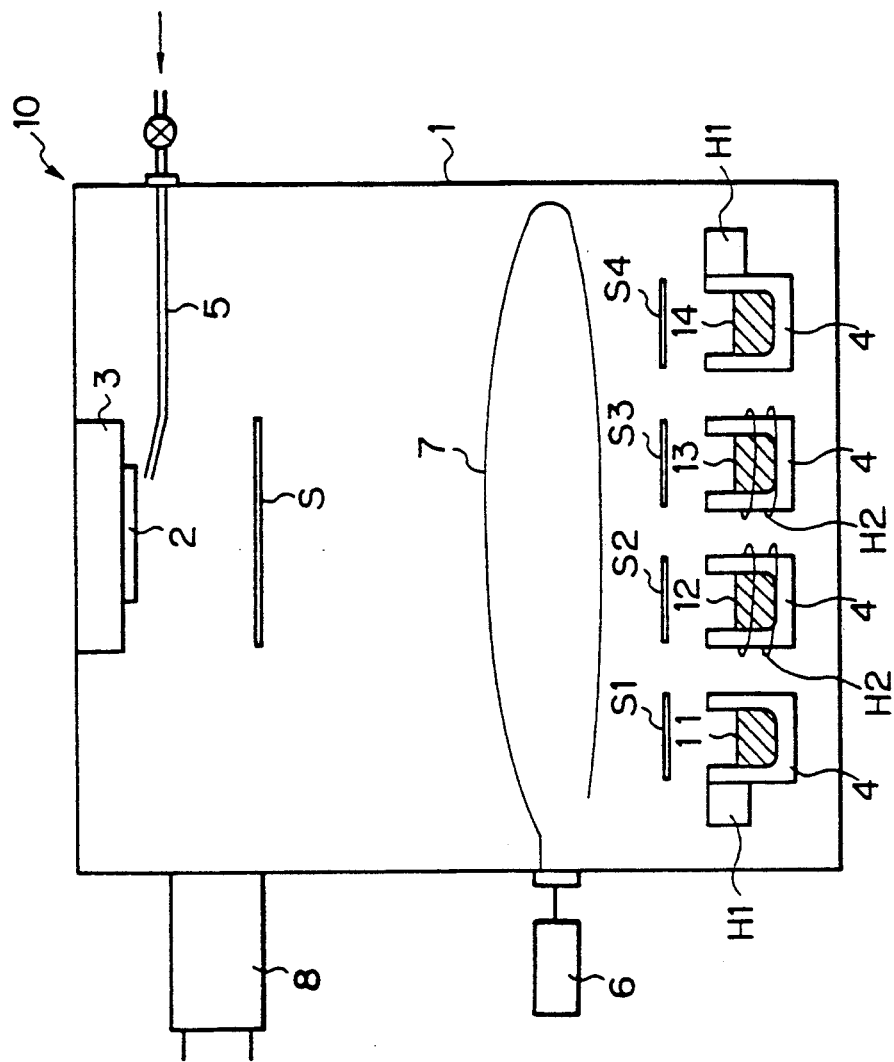
FIG. 1 exemplifies an arrangement of a reactive vapor deposition apparatus for carrying out the present invention.

The present invention will be described in further details, by comparison with the conventional processes.

In the conventional process in which a powder mixture is fired, the component elements in the as-mixed condition are three-dimensionally randomly distributed and are then positioned on the respective stable sites during the heating for firing. This means that, in the as-mixed condition, it is actually impossible to obtain a uniform distribution of chemical composition in an atomic scale over the whole volume of a thin film, and that such an atomic scale nonuniformity is not completely eliminated during firing, i.e., the component elements are locally positioned on the respective stable sites to form a mixture in which a plurality of phases having close free energies for formation are formed from region to region.

In another conventional process using a deposition by vapor deposition or sputtering on a heated substrate, atoms arrive at the substrate and randomly migrate over the substrate surface, seeking stable sites, to thereby cause a mixture of a plurality of phases and a three-dimensional nucleation.

In contrast, in the present invention, the chemical composition of a deposit on a substrate is controlled for each atomic layer corresponding to an atomic layer of a desired crystal structure, the layers of the thus-controlled compositions are laminated in an amorphous state to form an amorphous subunit which corresponds to a region having such lower and upper outermost atomic layers in a final crystalline film product that have relatively low interlayer bonding strengths. The amorphous subunit is then crystallized by heating.

The layer-by-layer deposition and heating steps can be cyclically repeated to form a number of subunits required to obtain a predetermined thickness of a crystalline film.

Such atomic layers having relatively low interlayer bonding strengths are typically those which provide a cleavage plane of the crystalline structure.

The deposition of the amorphous atomic layers means a deposition carried out under a condition under which atoms are prevented from moving on the substrate surface for crystallization, i.e., a deposition on a substrate held at a low temperature such that atoms does not migrate for crystallization. Accordingly, the amorphous state fixes a chemical composition distribution made strictly uniform on an atomic scale and the crystallization is effected by the subsequent heating of the thus-fixed uniform composition, to ensure a growth of an oxide crystal thin film without an ante-crystallization atom migration and a three-dimensional nucleation. The deposition of amorphous layers may be effected by a sputtering process, a vapor deposition process, or any other deposition process, but is not necessarily restricted to these processes. Any process can be used for the amorphous deposition as long as the component atoms freely moving in a space are deposited on a substrate, atomic layer by atomic layer, and the chemical composition controlled.

The present invention effects the deposition and crystallization steps for each subunit having lower and upper atomic layers having relatively low interlayer bonding strengths, because the thus-formed crystalline subunit is thermodynamically more stable than a crystal having other atomic layers as an outermost surface.

The present inventive process is particularly advantageously used for producing a multiple component, oxide crystal thin film, typically having a Perovskite type crystal structure.

The present inventive process is very useful for producing an oxide crystal in which the chemical compositional uniformity significantly affects the property, such as high temperature oxide superconductors.

Particularly, when used for producing a $Bi_2Sr_2Ca_2Cu_3O_{10}$ crystal thin film, the present invention eliminates the formation of a mixture of phases and ensures a high critical temperature Tc of 110K.

The present invention will be described in further detail by way of examples.

EXAMPLE

A $Bi_2Sr_2Ca_2Cu_3O_{10}$ high temperature superconductor thin film was produced according to the present invention.

Figure 2:
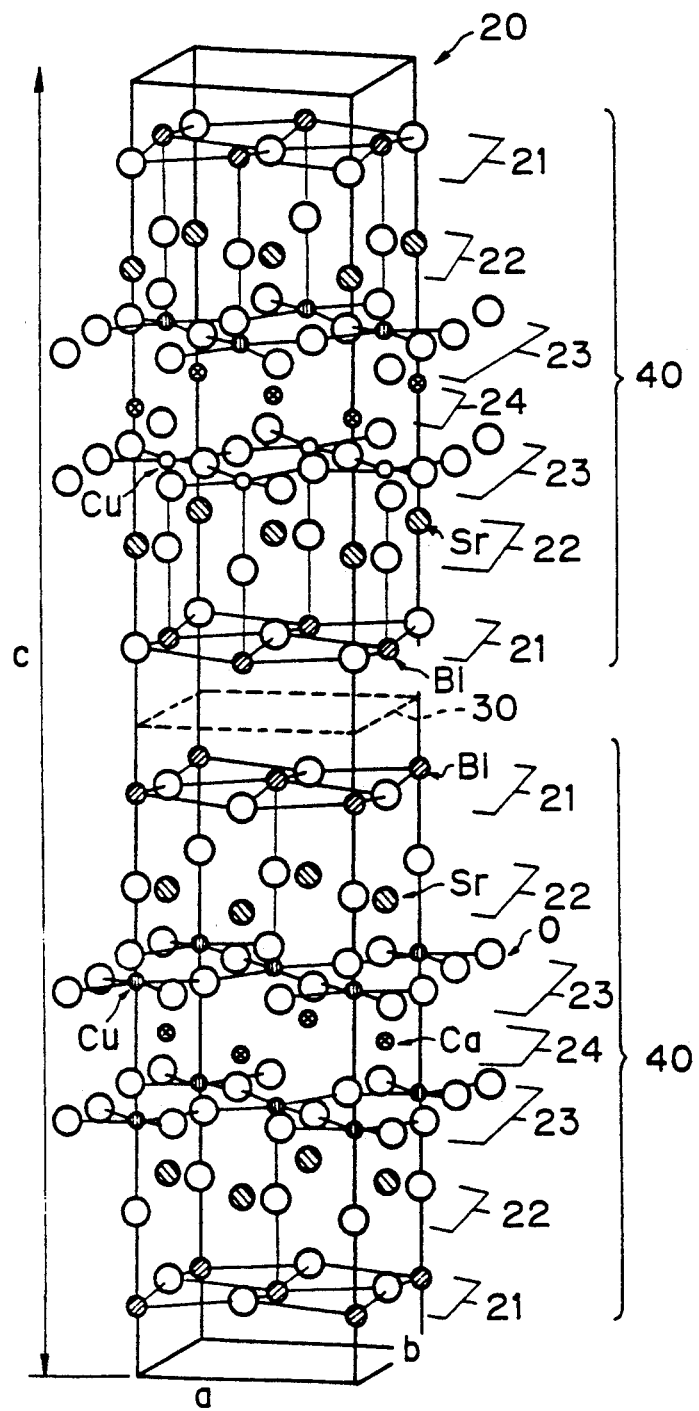
FIG. 2 schematically illustrates a unit cell of a $Bi_2Sr_2Ca_2Cu_3O_{10}$ high temperature superconductor.

FIG. 2 schematically illustrates a unit cell of a $Bi_2Sr_2Ca_2Cu_3O_{10}$ crystal. A cleavage plane 30 can be found at the $\frac{1}{2}$-position along the c-axis and between two BiO layers 21. A unit cell 20 is composed of a pair of Perovskite structure regions 40, which are located above and below the cleavage plane 30, respectively, and slightly twisted around the c-axis with respect to each other. Equivalent cleavage planes are also situated at the bottom and top planes of the unit cell 20. In each of the half cells having a height of $\frac{1}{2}$ of the c-axis, one Perovskite structure 40 is bordered with a pair of lower and upper cleavage planes. Atomic layers are arranged from the bottom side, along the c-axis perpendicular to the cleavage planes, and in the order of from a BiO layer 2 through a SrO layer 22, a $CuO_2$ layer 23, a Ca layer 24, a $CuO_2$ layer 23, a SrO layer 22 and a BiO layer 21, to complete a single Perovskite structure 40 at a border defined by the cleavage plane 30. Another Perovskite structure 40 above the cleavage plane 30 is also completed by the same arrangement of atomic layers.

In this example, one Perovskite structure 40 forming a bridge from a cleavage plane to a neighboring cleavage plane is defined as a subunit to be treated by one cycle of the deposition and crystallization steps, and this deposition and crystallization cycle is repeated to produce a thin film having a predetermined thickness.

FIG. 1 shows a reactive vapor deposition apparatus used for producing a crystal thin film in this example according to the present invention. The reactive vapor deposition apparatus 10 comprises a growth chamber 1 containing therein a substrate 2, a substrate holder 3 having therein a device for heating and cooling the substrate 2, source vessels 4 provided with the respective devices for heating sources contained therein, a pipe 5 for feeding $O_2$-gas, a high frequency power supply 6, a high frequency electrode 7 connected to the power supply 6, and shutters S, S1, S2, S3, and S4. The inner space of the growth chamber 1 is evacuated by an exhausting system 8 to a vacuum condition in accordance with need. The source vessels 4 contains sources in the form of a $Bi_2O_3$ powder 11, a Cu powder 12, a Ca powder 13, and a $SrF_2$ powder 14. The source vessels 4 containing the high melting point compound sources $Bi_2O_3$ and $SrF_2$ are equipped with an electron gun heater H1 and the other source vessels 4 containing the relatively low melting point metallic sources Cu and Ca are equipped with an electric resistance heater H2.

A $Bi_2Sr_2Ca_2Cu_3O_{10}$ crystal thin film as shown in FIG. 2 is produced by using the apparatus of FIG. 1, in the following sequence.

After the inner space of the growth chamber is evacuated by the exhausting system 8, the required source powders 11 to 14 are heated to evaporation, the thus-evaporated particles are activated by a high frequency plasma generated by the high frequency electrode 7 to an extent such that they reach the substrate 2, on which the particles react with the oxygen introduced through the feeding pipe 5, to form a deposit. The deposition is effected in such a manner that the substrate 2 is cooled by the integrated cooling device of the substrate holder 3 (by liquid nitrogen etc.) at a low temperature, to ensure an amorphous deposition and prevent a migration of atoms in the deposit. By opening or closing the shutters S1 to S4, the evaporated particles from the respective source vessels 4 are selected to provide a composition of an atomic layer to be deposited. While introducing oxygen gas through the feeding pipe 5, amorphous atomic layers having compositions corresponding to those of the BiO (21), SrO (22), $CuO_2$ (23), Ca (24), $CuO_2$ (23), SrO (22) and BiO (21) atomic layers shown in FIG. 2 are deposited in that order. When these amorphous atomic layers are deposited to form one subunit corresponding to one Perovskite structure 40, the shutter S is closed to stop the deposition. The substrate 2 is heated by a heating device (electric resistance heater, etc.) integrated in the substrate holder 3 to a high temperature, to crystallize the subunit. When the deposition and crystallization steps are carried out twice, a $Bi_2Sr_2Ca_2Cu_3O_{10}$ crystal thin film having a thickness of the unit cell height, c, is formed. A crystal thin film having a predetermined thickness is obtained by cyclically repeating the deposition and crystallization steps.

A $Bi_2Sr_2Ca_2Cu_3O_{10}$ crystal thin film was produced in the above-mentioned sequence.

An MgO single crystal substrate 2 was cooled by liquid nitrogen to 77K, and amorphous atomic layers having compositions corresponding to those of the BiO (21), SrO (22), $CuO_2$ (23), Ca (24), $CuO_2$ (23), SrO (22) and BiO (21) atomic layers shown in FIG. 2 were then deposited in that order on the (100) substrate plane. The deposition was carried out in an oxygen atmosphere of $1 \times 10^{-4}$ Torr under an applied high frequency power of 200 W.

The growth chamber was then filled with oxygen gas at 1 atm and the substrate 2 was heated to 600° C. by energizing an integrated electric resistance heater to anneal the deposit, with the result that the amorphous deposit was crystallized by a solid phase epitaxial reaction. A three-dimensional nucleation did not occur because of the low annealing temperature of 600° C.

The deposition and annealing steps were then cyclically repeated 20 times; i.e., the deposition on the substrate 2 cooled at 77K, and the annealing in the 1 atm oxygen atmosphere.

The above-repeated deposition and annealing provided a 360 Å thick $Bi_2Sr_2Ca_2Cu_3O_{10}$ crystal thin film on the MgO substrate 2, the film surface having a good flatness, i.e., an unevenness of 18 Å at most, which corresponds to one half the height "c" of the unit cell 20.

Figure 3A:
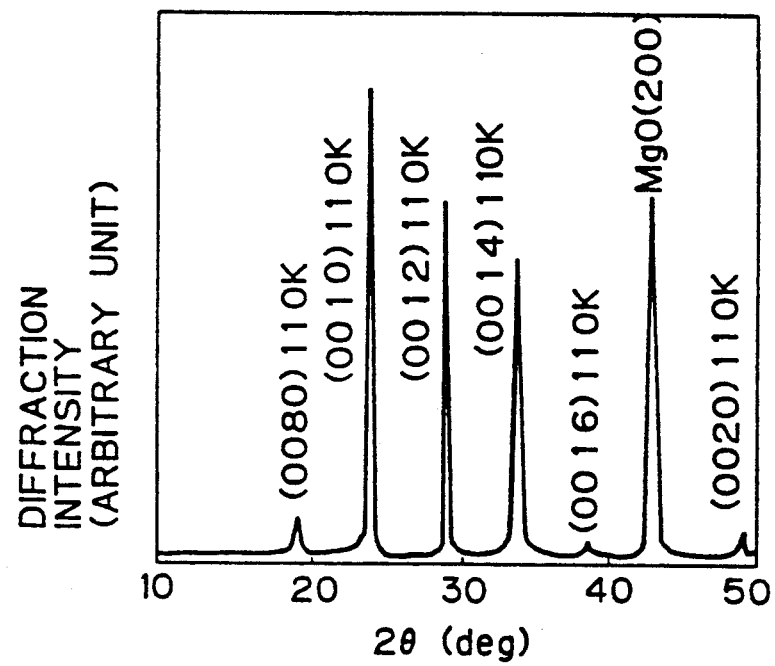
FIG. 3(a) and 3(b) show X-ray diffraction charts for $Bi_2Sr_2Ca_2Cu_3O_{10}$ thin films produced by (a) a process according to the present invention and (b) a conventional process, respectively; and, FIG. 4 is a schematic sectional view of a three-dimensional nucleation which occurs during the thin film growth by a conventional process.

An X-ray diffraction analysis was carried out to identify phases present in the thus-produced thin film, and proved that the thin film was composed of a single $Bi_2Sr_2Ca_2Cu_3O_{10}$ phase, or a Tc=110K phase as shown in FIG. 3(a). A cryostatical measurement of the electrical resistance variation vs. temperature also proved that the film had a critical temperature Tc of 110K.

The deposition of amorphous layers may be carried out by any process other than a reactive vapor deposition as used herein; for example, a similar result can be obtained when the deposition is effected by a reactive magnetron sputtering in an oxygen gas atmosphere of $3 \times 10^{-1}$ Torr or the like.

COMPARATIVE EXAMPLE

Another $Bi_2Sr_2Ca_2Cu_3O_{10}$ crystal thin film was produced on a heated substrate 2 by sputtering.

A thin film was produced by a single-targeted, reactive magnetron sputtering at a substrate temperature of 700° C. in an oxygen gas atmosphere of $3 \times 10^{-1}$ Torr to an average thickness of 200 Å.

Figure 3B:
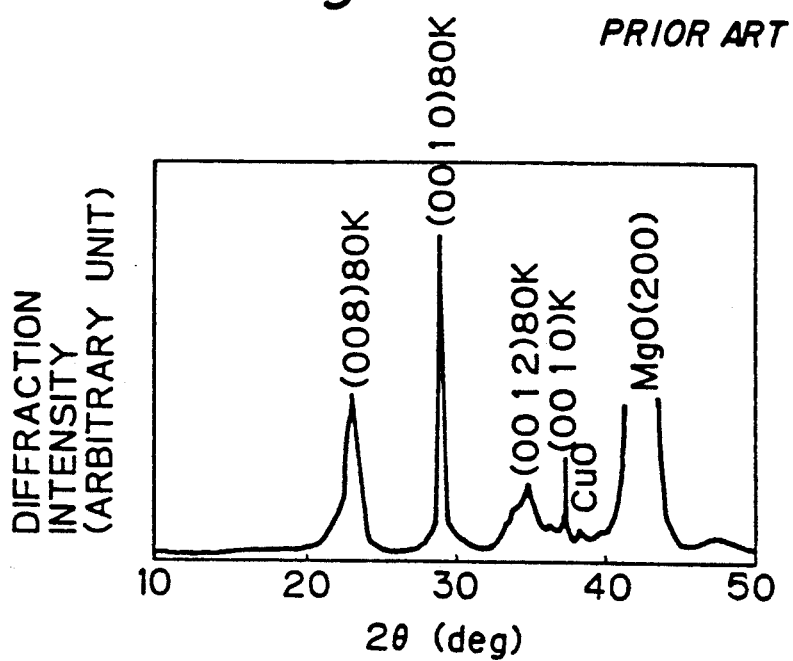
Figure 4:
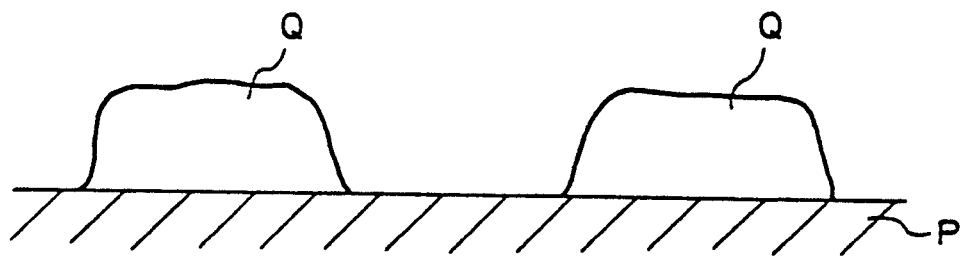

The thus-obtained film was an aggregate of discrete islands having a thickness of 400 Å and covered only 50% of the substrate surface. An X-ray diffraction analysis proved that this thin film contained a $Bi_2Sr_2Cu_1O_6$ phase (Tc=7K), a $Bi_2Sr_2Ca_1Cu_2O_8$ phase (Tc=80K), and a $CuO_2$ phase, other than the desired $Bi_2Sr_2Ca_2Cu_3O_{10}$ phase (Tc=110K), as shown in FIG. 3(b).

Although a $Bi_2Sr_2Ca_2Cu_3O_{10}$ high temperature superconductor is described in this example, it is obvious that the present invention can be generally applied to a process for producing oxide crystal thin films, preferably having a cleavage plane, such as $Tl_2Ba_2Ca_2Cu_3O_{10}$ having a Tc of 120K and a cleavage plane located between a pair of T10 planes.

As described above, the present invention provides an oxide crystal thin film composed of a desired single phase and having a flat surface, by preventing a mixture of phases and a three-dimensional nucleation. The present invention is particularly advantageous for producing oxide crystal thin films having properties which are sensitively affected by the chemical composition, such as high temperature oxide superconductor thin films.

I claim:

1. A process for producing a bismuth-based oxide superconductor film having a crystal structure in which atomic layers having different chemical compositions are laminated along the film thickness direction and each of unit cells of said crystal structure consists of a pair of lower and upper half cells having half the height of the unit cell and each bordered with a cleavage plane at the top and the bottom thereof, said process comprising the steps of:

depositing, on a substrate, amorphous atomic layers respectively having chemical compositions corresponding to those of atomic layers of said crystal structure, layer by layer in the film thickness direction to form an amorphous subunit of said amorphous atomic layers laminated in a number and an order corresponding to said lamination of said atomic layers of said half cell of said crystal structure, lowermost and uppermost amorphous atomic layers defining a plane corresponding to said cleavage plane;

heating said subunit in an oxygen-containing atmosphere to crystallize the subunit; and repeating a cycle of said deposition and crystallization steps to form a number of the crystallized subunits required to form said oxide superconductor film.

2. A process according to claim 1, wherein said oxide superconductor film was a Perovskite crystal structure.

3. A process according to claim 1, wherein said bismuth-based oxide superconductor film is composed of a $Bi_2Sr_2Ca_2Cu_3O_{10}$ oxide.

* * * * *